United States Patent
Ooya

(12) United States Patent (10) Patent No.: US 8,420,547 B2
Ooya (45) Date of Patent: Apr. 16, 2013

(54) PLASMA PROCESSING METHOD

(75) Inventor: Yoshinobu Ooya, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 431 days.

(21) Appl. No.: 12/707,211

(22) Filed: Feb. 17, 2010

(65) Prior Publication Data

US 2010/0210114 A1 Aug. 19, 2010

Related U.S. Application Data

(60) Provisional application No. 61/228,648, filed on Jul. 27, 2009.

(30) Foreign Application Priority Data

Feb. 18, 2009 (JP) ................................ 2009-035344

(51) Int. Cl.
*H01L 21/308* (2006.01)

(52) U.S. Cl.
USPC ........... 438/714; 438/706; 438/710; 438/719; 438/723; 438/729; 438/735; 438/737; 438/743; 216/12; 216/58; 216/62; 216/63; 216/67; 216/71; 216/74; 216/79; 257/E21.218

(58) Field of Classification Search .................. 438/729, 438/706, 710, 689, 714, 719, 723, 735, 737, 438/743; 21/12, 58, 62, 63, 67, 71, 74, 79; 257/E21.218
See application file for complete search history.

(56) References Cited

U.S. PATENT DOCUMENTS

| 6,187,685 | B1 * | 2/2001 | Hopkins et al. | 438/710 |
| 2005/0048787 | A1 * | 3/2005 | Negishi et al. | 438/706 |
| 2008/0020583 | A1 * | 1/2008 | Ueda et al. | 438/717 |
| 2008/0029483 | A1 * | 2/2008 | Ventzek et al. | 216/58 |
| 2009/0275207 | A1 * | 11/2009 | Honda et al. | 438/729 |

FOREIGN PATENT DOCUMENTS

| JP | 2005-72518 A | 3/2005 |
| JP | 2006-270019 | 10/2006 |
| WO | 2008/021609 A1 | 2/2008 |

* cited by examiner

*Primary Examiner* — Lan Vinh
*Assistant Examiner* — David Kaufman
(74) *Attorney, Agent, or Firm* — Rothwell, Figg, Ernst & Manbeck, P.C.

(57) ABSTRACT

A plasma processing method performed in a plasma processing apparatus including a processing chamber accommodating a substrate in which a plasma is generated; a mounting table mounting the substrate, which is provided in the processing chamber and to which a plasma attraction high frequency voltage is applied; and a facing electrode provided to face the mounting table in the processing chamber, to which a negative DC voltage is applied, the method including: applying a plasma attraction high frequency voltage to the mounting table for a predetermined period of time; and stopping the application of the plasma attraction high frequency voltage to the mounting table. In the plasma processing method, the application of the plasma attraction high frequency voltage and stopping thereof are alternately repeated.

13 Claims, 6 Drawing Sheets

PLASMA PROCESSING METHOD

CROSS-REFERENCE TO RELATED APPLICATION

This application claims the benefit of priority to Japanese Patent Application No. 2009-035344, filed on Feb. 18, 2009, the entire contents of which are incorporated herein by reference.

FIELD OF THE INVENTION

The present invention relates to a plasma processing method; and, more particularly, to a plasma processing method performed in a plasma processing apparatus in which a bias voltage is applied to a mounting table for mounting a substrate and a direct voltage is applied to an electrode facing the mounting table.

BACKGROUND OF THE INVENTION

A plasma processing apparatus for performing a plasma processing on a wafer serving as a substrate includes a processing chamber for accommodating the wafer therein, a mounting table for mounting thereon the wafer in the processing chamber, a shower head for supplying a processing gas into the processing chamber, which is provided to face the mounting table. In the plasma processing apparatus, high frequency power sources for plasma generation and for plasma attraction are connected to the mounting table.

More specifically, the high frequency voltage for plasma generation is applied to the mounting table in the processing chamber, by which a processing gas supplied into the processing chamber is excited to generate a plasma (i.e., positive ions and/or electrons). The generated positive ions and electrons are attracted to the wafer mounted on the mounting table by the high frequency voltage (referred to as a 'bias voltage' hereinafter) which is applied thereto. The wafer is physically etched by the positive ions attracted thereto.

In recent years, by achieving an increased electron density within the processing chamber to thereby increase the number of electrons arriving at the wafer, there has been made close investigations on the possibility for aggressively employing electrons to perform processes on the wafer, e.g., reforming process of a photoresist film on the wafer or alleviating process of shading effect.

There is known a plasma processing apparatus in which a direct voltage is applied to a shower head, in order to increase an electron density in a processing chamber (see, e.g., Japanese Application Publication No. 2006-270019). In this plasma processing apparatus, a direct current (DC) power source is connected to a disk-like upper electrode which is included as a component of the shower head and exposed in the processing chamber.

Herein, if a negative DC voltage is applied to the upper electrode, only positive ions in the plasma will be attracted to the upper electrode. Since a potential is a constant in the DC voltage unlike as in the high frequency voltage, the positive ions are continuously attracted to the upper electrode to thereby collide therewith. Secondary electrons are emitted from atoms in the upper electrode by the positive ions colliding therewith, thereby increasing the electron density in the processing chamber.

Further, as the mounting table is applied with a bias voltage, a sheath is generated above the wafer, which is a region of high electron density. The positive ions are accelerated toward the wafer by the sheath, thereby physically etching it.

However, since the sheath repels electrons, it becomes difficult for the secondary electrons emitted from the upper electrode to arrive at the wafer. In other words, if the mounting table is applied with the bias voltage in order to perform an etching process onto the wafer, the electrons cannot be used to carry out a process on the wafer.

SUMMARY OF THE INVENTION

In view of the above, the present invention provides a plasma processing method capable of performing an etching process while performing a process by using electrons on the substrate.

In accordance with an aspect of the present invention, there is provided a plasma processing method performed in a plasma processing apparatus including a processing chamber accommodating a substrate in which a plasma is generated; a mounting table mounting the substrate, which is provided in the processing chamber and to which a plasma attraction high frequency voltage is applied; and a facing electrode provided to face the mounting table in the processing chamber, to which a negative DC voltage is applied, the method including: applying a plasma attraction high frequency voltage to the mounting table for a predetermined period of time; and stopping the application of the plasma attraction high frequency voltage to the mounting table. In the plasma processing method, the application of the plasma attraction high frequency voltage and stopping thereof are alternately repeated.

BRIEF DESCRIPTION OF THE DRAWINGS

The objects and features of the present invention will become apparent from the following description of preferred embodiments, given in conjunction with the accompanying drawings, in which:

FIG. 2B explains a process for curing a photoresist film of the wafer; and FIG. 2C presents a process for dry etching a thermal oxidation;

FIGS. 3A and 3B are cross sectional views for explaining a state that a bias voltage is applied to a susceptor in the plasma processing apparatus shown in FIG. 1, wherein FIG. 3A illustrates a sheath generated in the state that a bias voltage is applied to a susceptor; and FIG. 3B is a view for explaining influence of the sheath on secondary electrons or positive ions;

FIGS. 4A and 4B depict cross sectional views for representing a flow of a DC current while a negative DC voltage is being applied to an upper electrode in the plasma processing apparatus shown in FIG. 1, wherein FIG. 4A shows a case that a magnitude of the negative DC voltage is relatively small; and FIG. 4B presents a case that the magnitude of the negative DC voltage is relatively large.

DETAILED DESCRIPTION OF THE EMBODIMENTS

Hereinafter, a plasma processing method in accordance with an embodiment of the present invention will be described in detail with reference to accompanying drawings which form a part hereof, but the invention is not limited thereto.

Figure 1:
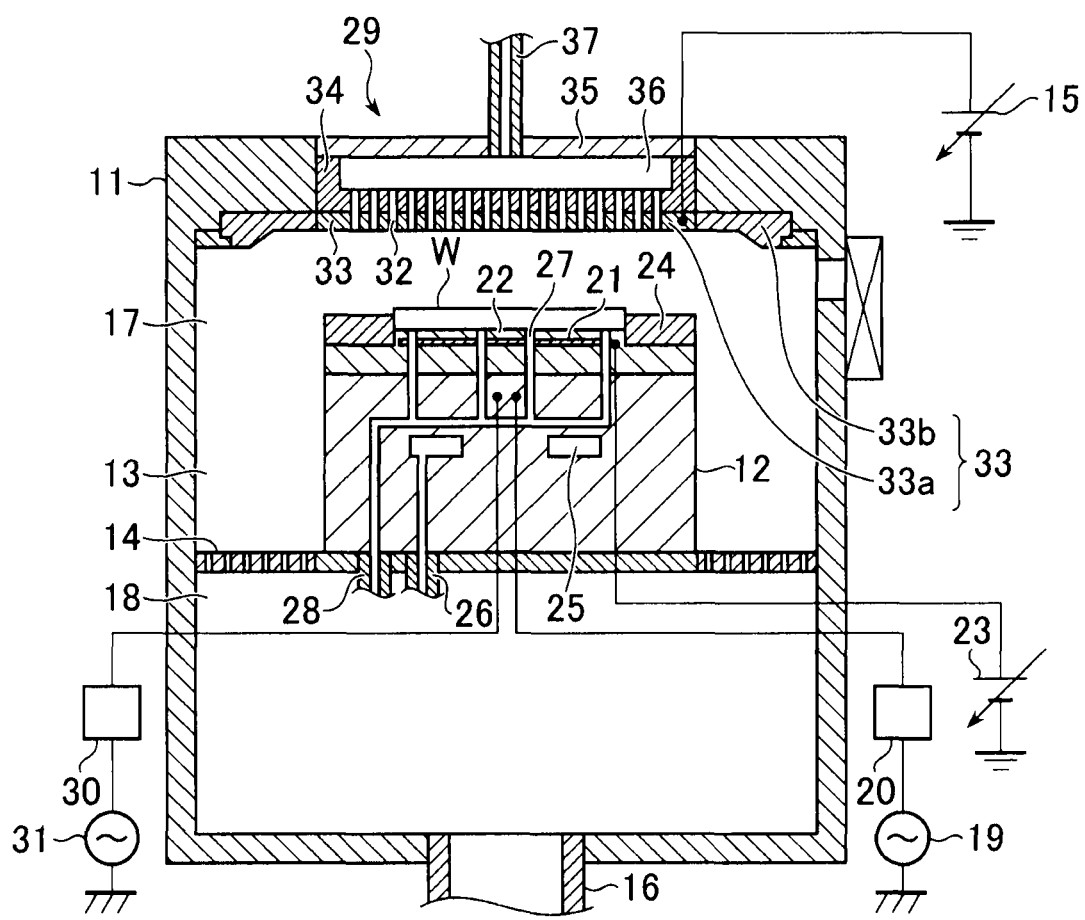
FIG. 1 is a cross sectional view showing a schematic configuration of a plasma processing apparatus executing a plasma process method in accordance with an embodiment of the present invention.

FIG. 1 is a cross sectional view schematically showing a configuration of a plasma processing apparatus which executes a plasma processing method in accordance with the embodiment of the present invention. The plasma processing apparatus performs a dry etching process on a wafer for a semiconductor device.

Referring to FIG. 1, the plasma processing apparatus includes a processing chamber 11 for accommodating therein a wafer having a diameter of, e.g., 300 mm, and a cylindrical susceptor 12 (mounting table) provided in the processing chamber 11, for mounting the wafer W thereon. In the plasma processing apparatus 10, a side exhaust path 13 is formed by an inner wall of the chamber 11 and a side wall of the susceptor 12, which serves as a flow path for exhausting gas from above the susceptor 12 to outside of the chamber 11. An exhaust plate 14 is provided in the side exhaust path 13.

The exhaust plate 14 is a sheet-like member having plural holes therein, which serves as a partition separating the inside of the chamber 11 into an upper and a lower portion thereof. A plasma is generated in the upper portion (referred to as a 'reaction chamber' hereinafter) partitioned by the exhaust plate 14 in the chamber 11. Connected to the lower portion 18 (referred to as an 'exhaust chamber (manifold)' hereinafter) of the chamber 11 is an exhaust line 16 which exhausts a gas from the inside of the chamber 11. The exhaust plate 14 serves to prevent the plasma generated in the reaction chamber 17 from leaking to the manifold 18 by picking up or reflecting the plasma.

Connected to the exhaust line 16 is a TMP (Turbo Molecular Pump) and DP (Dry Pump), not shown, which depressurize by vacuum exhausting the inside of the chamber 11. More specifically, the DP depressurizes the inside of the chamber 11 from an atmospheric state to a semi-vacuumed state, e.g., below $1.3 \times 10$ Pa (0.1 Torr), and the TMP cooperates with the DP to depressurize to a high vacuumed state, e.g., below $1.3 \times 10^{-3}$ Pa ($1.0 \times 10^{-5}$ Torr) which is a pressure lower than the semi-vacuumed state. Further, an inner pressure of the chamber 11 is controlled by an APC valve, not shown.

Connected to the susceptor 12 in the chamber 11 are a first high frequency power source 19 via a first matcher 20 and a second high frequency power source 31 via a second matcher 30. The first high frequency power source 19 applies a high frequency voltage for plasma attraction (referred to as a 'bias voltage' hereinafter) having a relatively low frequency to the susceptor 12, while the second high frequency power source 31 supplies a high frequency voltage for plasma generation having a relatively high frequency to the susceptor 12. Accordingly, the susceptor 12 serves as an electrode. Further, the first and the second matcher 20 and 30 alleviate reflection of the high frequency voltages from the susceptor 12.

Provided above the susceptor 12 is an electrostatic chuck 22 having an electrostatic electrode plate 21 therein. The electrostatic chuck 22 has a shape in which a disk-like upper member stacks on a disk-like lower member which has a diameter greater than that of the upper member. Further, the electrostatic chuck 22 is made of ceramics or the like.

A first DC power source 23 is connected to the electrostatic electrode plate 21 in the electrostatic chuck 22. When a positive DC voltage is applied to the electrostatic electrode plate 21, a negative potential is generated on a surface of the wafer W, i.e., on a bottom surface of the wafer W facing the electrostatic electrode plate 21, thereby developing a difference of potential between the electrostatic electrode plate 21 and the bottom surface of the wafer W. Accordingly, by Coulomb's force or Johnson Rahbek's force caused by the difference of potential, the wafer W is adsorbed and kept on the upper member in the electrostatic chuck 22.

Further, a focus ring 24 is provided to surround the wafer W adsorbed and kept on the electrostatic chuck 22. The focus ring 24 is an annular member made of a single crystalline silicone which is same as a material of which the wafer W is made, e.g., a semiconductor. As such, since the focus ring 24 is made of a semiconductor, a distribution region of the plasma can be broadened onto an area above the focus ring 24 in addition to the area above the wafer W, thereby keeping a uniformity of plasma densities on a peripheral portion and a central portion of the wafer W. Accordingly, there can be achieved uniformity of a dry etching process which is executed all over the surface of the wafer W.

An annular coolant chamber 25 is provided in the susceptor 12 which extends in a circumferential direction of the susceptor 12. A low temperature coolant, e.g., cooling water, Galden (C,F,O) or the like, is supplied from a chiller unit (not shown) to the coolant chamber 25 via a coolant pipe 26 to be circulated therethrough. The susceptor 12 is cooled by the low temperature coolant and cools the wafer W and the focus ring 24 via the electrostatic chuck 22.

A plurality of heat transfer gas supply openings 27 are provided in portions of the electrostatic chuck 22 (referred to as a 'adsorbing surface' hereinafter) which adsorb and hold the wafer W on the disk-like upper member. The heat transfer gas supply openings 27 are connected via a heat transfer gas supply line 28 to a heat transfer gas supply unit (not shown), which supplies a heat transfer gas, e.g., He gas, via the heat transfer gas supply openings 27 to a gap between the adsorbing surface and a back surface of the wafer W. The supplied He gas serves to effectively transfer heat from the wafer W to the electrostatic chuck 22.

At a ceiling of the chamber 11, a shower head 29 is arranged to face the susceptor 12. The shower head 29 has an upper electrode 33 (facing electrode), a cooling plate 34 detachably holding the upper electrode 33, and a lid 35 covering the cooling plate 34. In the cooling plate 34, a buffer chamber 36 is provided to which a processing gas inlet pipe 37 is connected.

A second DC power supply 15 is connected to the upper electrode 33 to which a negative DC voltage is applied. Further, the upper electrode 33 includes an inner electrode 33a having plural gas holes 32, which is formed of an electrical conductive disk-like member, and an outer electrode 33b arranged to surround the inner electrode 33a and formed of an electrical conductive ring-like member.

In the plasma processing apparatus 10, a processing gas supplied through the processing gas inlet pipe 37 to the buffer chamber 36 is introduced via the gas holes 32 to the reaction chamber 17. The introduced processing gas is excited to generate a plasma by a plasma generation high frequency voltage, which is applied from the second high frequency power supply 31 via the susceptor 12 to the inside of the reaction chamber 17. The generated plasma is attracted to the wafer W by a bias voltage which is applied to the susceptor 12 from the first high frequency power supply 19, thereby dry-etching the wafer W.

Besides, in the plasma processing apparatus 10, the second DC power supply 15 applies a negative DC voltage to the upper electrode 33 during the dry etching process. At this point, positive ions among the plasma generated in the reaction chamber 17 are attracted to the upper electrode 33. The attracted positive ions give its energy to electrons of atoms of the upper electrode 33. When the energy imparted to an electron exceeds a certain value, the electron is emitted as a secondary electron from the upper electrode 33.

Operations of parts in the plasma processing apparatus 10 described above are controlled by a CPU of a controller included in the plasma processing apparatus 10 based on predetermined programs.

Figure 2A:
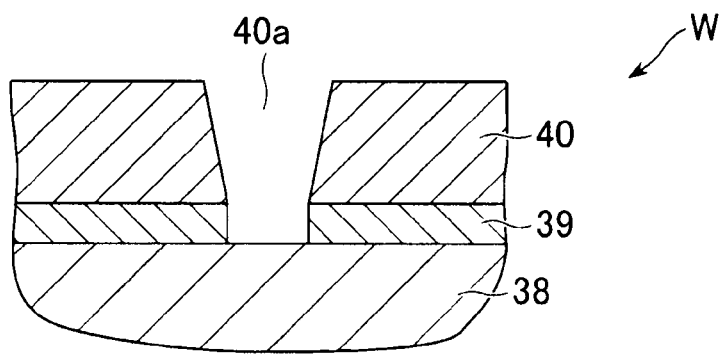
FIGS. 2A to 2C are cross sectional views for explaining a wafer for a semiconductor device to which the plasma processing is applied, in which FIG. 2A schematically depicts a configuration of the wafer.

FIG. 2A shows a wafer for a semiconductor device to which a plasma processing method in accordance with the embodiment is applied.

Referring FIG. 2A, the wafer W includes a base (not shown) made of silicon, a thermal oxide film 38 (target etching film) formed on the base, a BARC film 39 (antireflection film) formed on the thermal oxide film 38, and a photoresist film 40 formed on the BARC film 39, the photoresist film 40 serving as a mask film. Firstly, openings 40a are formed on the photoresist film 40 in a predetermined pattern and the BARC film 39 is partially exposed by the openings 40a. Then, the BARC film 39 is partially etched by using the photoresist film 40 as a mask and, as a result, a portion of the thermal oxide film 38 is exposed. FIG. 2A illustrates the wafer W at this state.

Figure 2B:
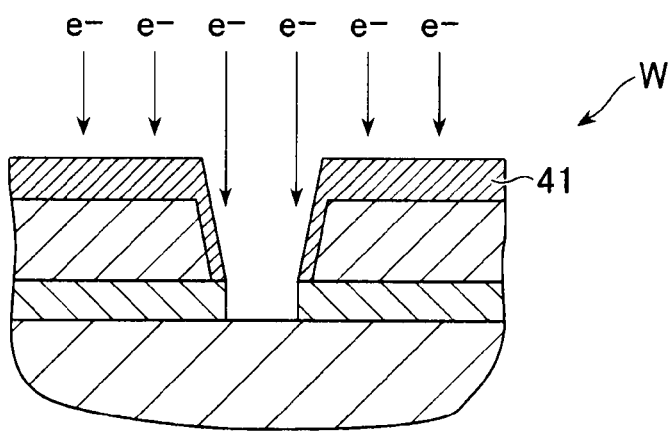
Figure 2C:
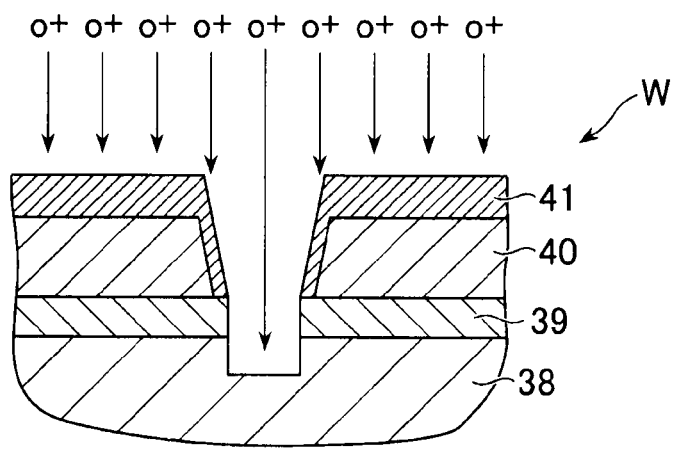

With the plasma processing apparatus 10 shown in FIG. 1, the secondary electrons (indicated by 'e⁻' in the drawing) emitted from the upper electrode 33 arrive at the wafer W, as shown in FIG. 2B, and change a part of the photoresist film 40 into a hardened layer 41 by a curing process. Next, the processing gas, e.g., a mixed gas including $C_4F_6$ gas, Ar gas and $O_2$ gas, is excited to generate a plasma and especially positive ions (indicated by 'O⁺' in the drawing) among the generated plasma are attracted to the wafer W, as shown in FIG. 2C. Accordingly, the partially exposed thermal oxide film 38 is physically etched by the attracted positive ions, thereby forming holes or trenches in the thermal oxide film 38.

When the dry etching process is performed, the plasma is also injected to the photoresist film 40. This is addressed as follows. Because the photoresist film 40 is more difficult to be etched than the thermal oxide film 38 by the plasma generated from $C_4F_6$ gas, Ar gas and $O_2$ gas, and is covered by the hardened layer 41, an etching amount of the thermal oxide film 38 can be increased by raising an etching selectivity of the photoresist film 40 against the thermal oxide film 38. As a result, there can be obtained a deep hole or trench.

Figure 3A:
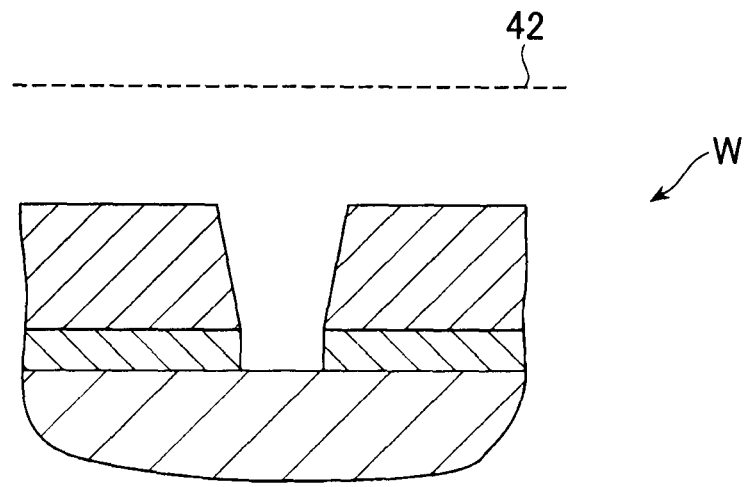
Figure 3B:
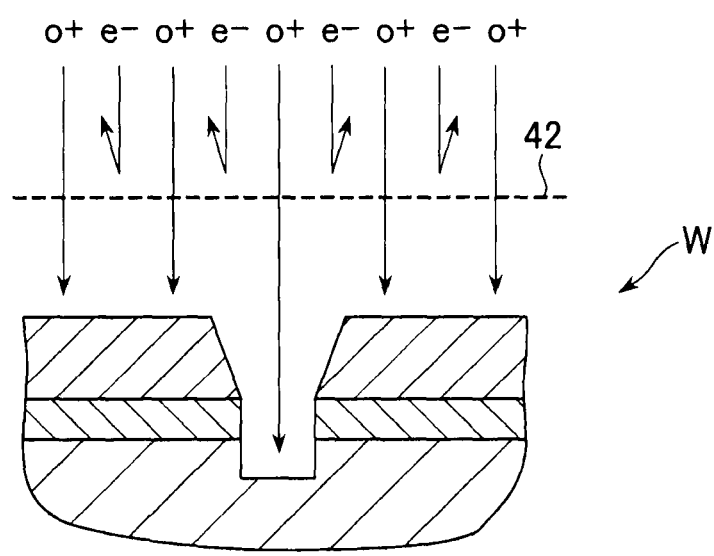

As shown in FIG. 3A, however, when the secondary electrons are emitted from a surface of the upper electrode 33, i.e., when a negative DC voltage is applied to the upper electrode 33, and the bias voltage is applied to the susceptor 12, a sheath 42 is generated right above the wafer W on the susceptor 12. Due to the sheath 42, the positive ions among the plasma are accelerated to the wafer W but the secondary electrons are repulsed, as shown in FIG. 3B. Accordingly, the positive ions arrive at the wafer W with ease, while the secondary electrons are hard to arrive thereto.

If the secondary electrons do not arrive at the wafer W, the hardened layer 41 cannot be formed on the photoresist film 40. Therefore, it is impossible to increase the etching selectivity of the photoresist film 40 against the thermal oxide film 38, and, as a result, a deep hole or trench cannot be formed. Further, an opening 40a of the photoresist film 40 have a shape whose opening is widened upwardly and, if the opening 40a is not covered, a side surface of the opening 40a is damaged by the positive ions. As a result, striations (roughness) may be formed on a side surface of the hole or trench provided at a lower portion of the opening 40a.

Figure 4A:
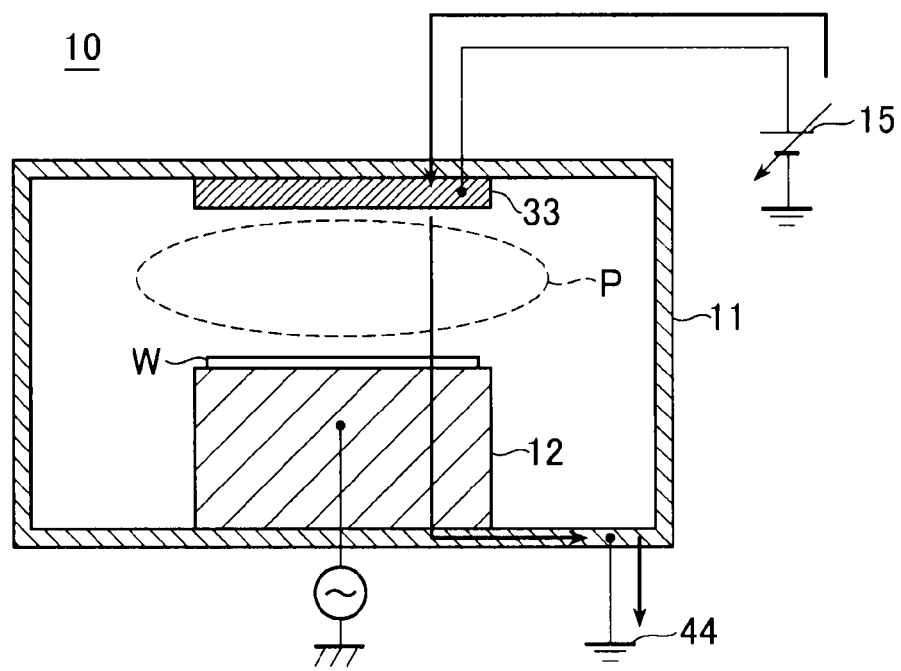

Meanwhile, as shown in FIG. 4A, when a plasma is generated in the reaction chamber 17 and a DC voltage is applied to the upper electrode 33 from the second DC power supply 15, in the plasma processing apparatus 10, a DC current caused by the DC voltage flows through the upper electrode 33, the plasma P, the wafer W, the susceptor 12 and a bottom of the chamber 11 into the ground 44.

Figure 4B:
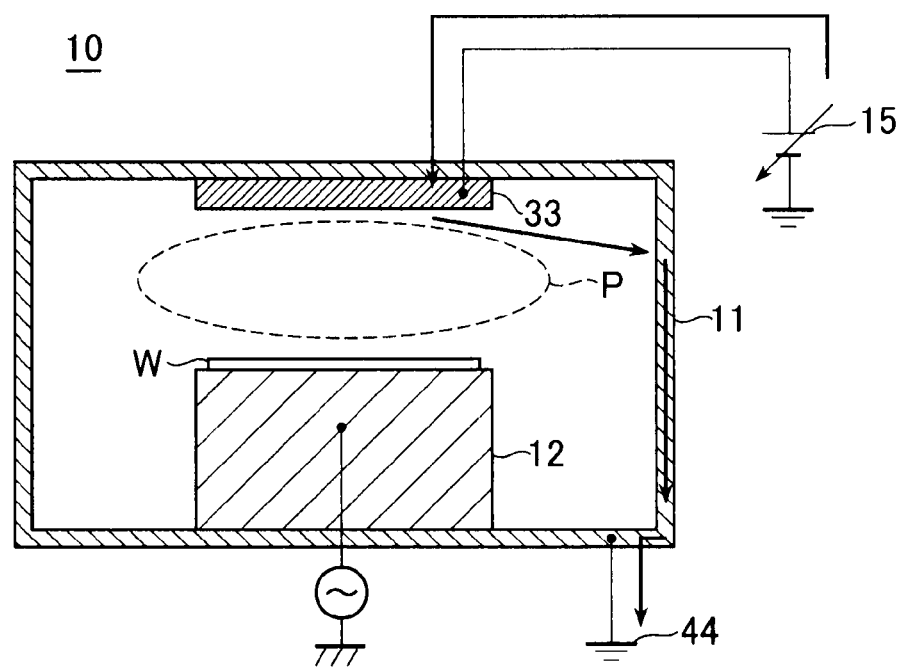

At this point, when the magnitude of the negative DC voltage applied to the upper electrode 33 is increased in order to improve an efficiency of the curing process of the photoresist film 40 and a bias voltage applied to the susceptor 12 is made larger in order to raise an efficiency of the dry etching process, since the bias voltage is a high frequency voltage, a large potential difference is generated between the susceptor 12 and the upper electrode 33 in conformity with a cycle of the high frequency voltage. Accordingly, the DC current (shown with an arrow in the FIG. 4B) increases by an amount corresponding to the potential difference. However, an equivalent circuit of the current path from the plasma P to ground 44 does not have a capacity big enough to allow a flow of a large current. As shown in FIG. 4B, therefore, the increased DC current bypasses the plasma P and flows from the upper electrode 33 via the sidewall of the chamber 11 into the ground 44. That is, when the magnitude of the negative DC voltage applied to the upper electrode 33 is larger than the certain value, a path of the DC current becomes unstable and, therefore, the plasma processing apparatus 10 may become unstable.

In the embodiment of the present invention, this is solved by alternately repeating to first apply a bias voltage to the susceptor 12 for a predetermined time and then stop the supply thereof. When the application of the bias voltage is stopped, the sheath is extinguished in a moment and the secondary electrons emitted from the upper electrode 33 can arrive at the wafer W. Further, even when the magnitude of the negative DC voltage becomes larger, the potential difference between the susceptor 12 and the upper electrode 33 does not become too large and, accordingly, the DC current induced by the DC voltage can flow through the plasma P via the bottom portion of the chamber 11 into the ground 44.

FIGS. 5A to 5D are views illustrating hole formation processes by a plasma processing method in accordance with an embodiment of the present invention.

At first, in the plasma processing apparatus 10, a wafer W is loaded on the susceptor 12 and an inside of the reaction chamber 17 is depressurized. Then, introduced into the reaction chamber 17 is a processing gas mainly including $CF_4$. And a plasma is generated from the processing gas by applying a plasma generation high frequency voltage and a bias voltage to the susceptor 12. The plasma partially etches a BARC film 39 exposed in openings 40a of a photoresist film 40. Thereafter, the applications of the plasma generation high frequency voltage and the bias voltage to the susceptor 12 are stopped.

Next, after residual gas of the processing gas is removed from the reaction chamber 17, the inside of the reaction chamber 17 is depressurized again and a processing gas including $C_4F_6$ gas, Ar gas and $O_2$ gas is introduced into the reaction chamber 17. Then, a plasma is generated from the processing gas by applying the plasma generation high frequency voltage to the susceptor 12 and a negative DC voltage is applied to the upper electrode 33.

At this point, secondary electrons are emitted from the upper electrode 33 but a sheath 42 is not formed right above the wafer W because the bias voltage is not applied to the susceptor 12. Therefore, the secondary electrons are not repulsed but are allowed to arrive at the wafer W, and can change a surface layer of the photoresist film 40 into a hardened layer 41 by curing process (high frequency non-application step) (see, e.g., FIG. 5A). Further, as described above, since the openings 40a are formed to widen upwardly, the secondary electrons also arrive at (or contact) a side surface of the openings 40a and the hardened layer 41 is formed thereon as well.

Next, while the plasma generation high frequency voltage is applied to the susceptor 12 and the negative DC voltage is applied to the upper electrode 33, a dry etching process is executed on the wafer W by applying the bias voltage to the susceptor 12 to thereby attract positive ions among the plasma to the wafer W (high frequency application step). Herein, physically etched is a part of the thermal oxide film 38 which is exposed since a part of the BARC film 39 thereabove has been etched and a hole 43 is formed in the thermal oxide film 38, but the secondary electrons hardly arrive at the wafer W because there is formed the sheath above the wafer W caused by the bias voltage.

In this regard, while the bias voltage is applied to the susceptor 12, the hardened layer 41 of the photoresist film 40 is physically etched just a little bit by the positive ions and will not grow any further. Further, some of the positive ions attracted to the hole 43 remain at a bottom portion thereof. Those positive ions affect motion of positive ions newly attracted to the hole 43 to deflect them and this may prevent from deeply forming the hole 43 in a desired pattern (shading effect). Applying the bias voltage to the susceptor 12 is continued for a predetermined period of time.

Figure 5A:
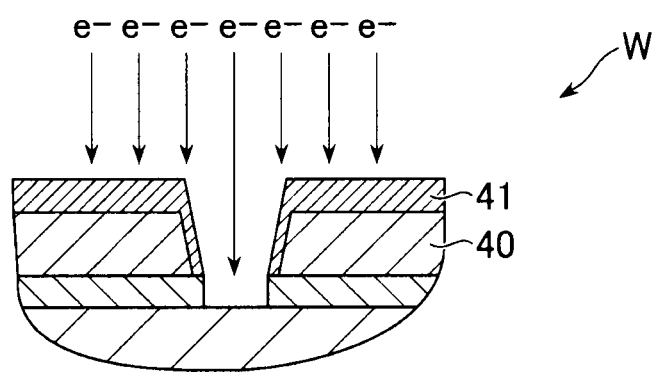
FIGS. 5A to 5D illustrate hole forming processes to which the plasma processing method in accordance with an embodiment of the present invention is applied.
Figure 5B:
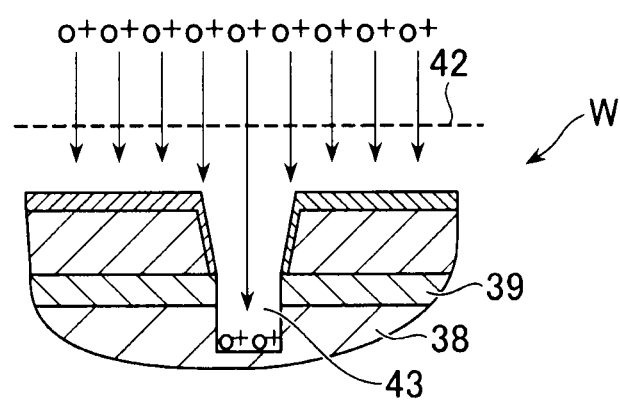
Figure 5C:
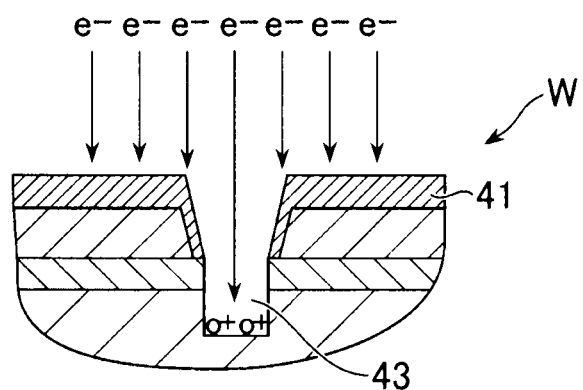

In the next, the application of the bias voltage is stopped (high frequency non-application step). At this point, the sheath 42 is extinguished in a moment and, accordingly, the secondary electrons emitted from the upper electrode 33 can arrive at the wafer W and the hardened layer 41 decreased by physically being etched by the positive ions is increased again. Further, the secondary electrons can also arrive at the bottom portion of the hole 43 and neutralize the positive ions remained there (FIG. 5C).

Figure 5D:
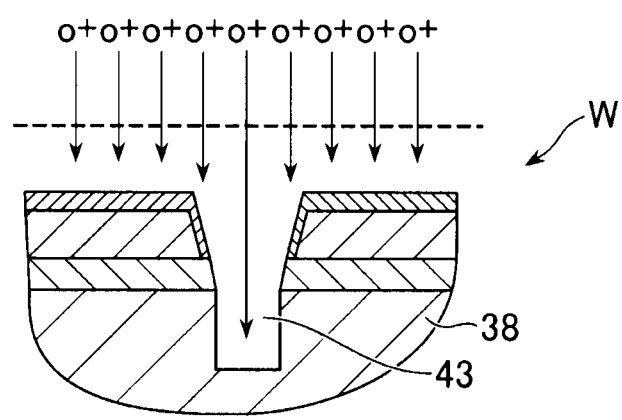

Subsequently, the wafer W is dry etched again by applying the bias voltage to the susceptor 12 and attracting the positive ions among plasma to the wafer W (high frequency application step). At this point, the bottom of the hole 43 in the thermal oxide film 38 is physically etched to thereby make the hole 43 deeper. However, since there are no positive ions at the bottom portion of the hole 43, the positive ions attracted into the hole 43 is not deflected away. Accordingly, the hole 43 can be deeply formed in a desired pattern (FIG. 5D).

In the present processes, processes from FIG. 5A to FIG. 5D are repeated until the hole 43 is formed in a desired depth.

With the hole formation process shown in FIGS. 5A to 5D, there are alternately repeated a high frequency application step where, during a predetermined period of time, the negative DC voltage is applied to the upper electrode 33 and the bias voltage is applied to the susceptor 12, and a high frequency non-application step where the application of the bias voltage to the susceptor is stopped. While the bias voltage is applied to the susceptor 12, the positive ions are attracted to the wafer W and a part of the thermal oxide film 38 is physically etched.

On the other hand, while the application of the bias voltage is stopped, the sheath 42 is extinguished in a moment. Therefore, the secondary electrons emitted from the upper electrode 33 can arrive at the wafer W and change the surface layer of the photoresist film 40 into the hardened layer 41 by a curing process. That is, there can be performed a dry etching process on the wafer W as well as a curing process of the photoresist film 40.

Further, in the hole formation process shown in FIGS. 5A to 5D, since an etching and a curing of the photoresist film 40 are alternately repeated, even when non-cured photoresist film 40 is exposed by etching, the surface layer of the non-cured photoresist film 40 is cured again. Therefore, upon dry etching, the photoresist film 40 is always covered by the hardened layer 41, thereby suppressing etching the photoresist film 40. Accordingly, etching of the thermal oxide film 38 can be performed during a relatively long period of time and, as a result, a deep hole 43 or trench can be formed in the thermal oxide film 38. Besides, since damage to the side surfaces of the openings 40a of the photoresist film 40 can be prevented, there can be prohibited a generation of the striation on the side surface of the hole or trench caused by the damages on the openings 40a.

In the hole formation process described above, it is unnecessary to change the magnitude of the negative DC voltage applied to the upper electrode 33 depending on whether the bias voltage is applied to the susceptor 12 or not. However, while the application of the bias voltage is stopped, the magnitude of the negative DC voltage may be made larger. By doing so, the number of the secondary electrons emitted from the upper electrode 33 can be increased, and therefore, much more secondary electrons can arrive at the wafer W, thereby achieving an improvement in a rate of the curing process of the photoresist film 40. For this, the negative DC voltage may be set to −600 V or less, preferably, −1800 V or less. Accordingly, the number of the secondary electrons emitted from the upper electrode 33 can be further increased.

In the hole formation process described above with reference to FIGS. 5A to 5D, the predetermined period of time during which the bias voltage is applied to the susceptor 12 may range from about 1 sec to 120 sec. If a value of the negative DC voltage applied to the upper electrode 33 is, e.g., −1800 V, the hardened layer 41 having, e.g., 100 nm thickness is formed at a top surface of the photoresist film 40 and it needs 120 sec to etching 100 nm thickness of the hardened layer 41. Therefore, when the bias voltage is applied to the susceptor 12, it can be certainly prevented to have a non-cured photoresist film 40 exposed.

On the other hand, when the value of the negative DC voltage applied to the upper electrode 33 is changed depending on whether the bias voltage is applied to the susceptor 12 or not, it takes about 0.5 sec until the changed negative DC voltage becomes stable. In this regard, a duration for which the application of the bias voltage is kept is, e.g., one second or more, the negative DC voltage can become stable.

Further, in the above-mentioned hole formation process shown in FIGS. 5A to 5D, a duration for which a bias voltage is applied to the susceptor 12 may differ from a duration of non-application of the bias voltage. The duration of non-application may be a period of time long enough for which there can be formed a sufficient thickness of hardened layer 41.

Furthermore, a target film to be processed by using secondary electrons is the photoresist film 40 in the above-mentioned hole formation process shown in FIGS. 5A to 5D, but may be an organic Low-k film or SOG (spin on glass) film. These films are changed by using the secondary electrons and the performance of the semiconductor manufactured by using the wafer including these films can also be improved.

In the present embodiment described above, a substrate to be dry etched is a wafer for a semiconductor device but not limited thereto, and may be, a glass substrate, e.g., FPD (Flat Panel Display) including LCD (Liquid Crystal Display), or the like.

Further, it is to be understood that the present invention can also be realized by supplying to a computer (e.g., a control unit) a storage medium in which program codes of software that implement the functions of the aforementioned embodiments are stored, and then causing a CPU of the computer to read out and execute the program codes stored in the storage medium.

In this case, the program codes themselves read out from the storage medium realize the functions of the aforementioned embodiments and, hence, the program codes and the storage medium in which the program codes are stored fall within a scope of the present invention.

Moreover, the storage medium for supplying the program codes may be, e.g., a RAM, an NVRAM, a floppy (registered trademark) disk, a hard disk, a magnetic-optical disk, an optical disk such as a CD-ROM, a CD-R, a CD-RW, a DVD (a DVD-ROM, a DVD-RAM, a DVD-RW, a DVD+RW) or the like, a magnetic tape, a non-volatile memory card, another ROM or the like. Alternatively, the program codes may be supplied to the computer by downloading from another computer (not shown), a database or the like connected to the Internet, a commercial network, a local area network or the like.

Besides, it is to be understood that the functions of the aforementioned embodiments may be accomplished not only by executing the program codes read out by the computer, but also by causing an OS (operating system) or the like that operates on the CPU to perform a part or all of the actual operations based on instructions of the program codes.

Further, it is to be understood that the functions of the aforementioned embodiments may also be accomplished by writing the program codes read out from the storage medium into a memory provided on a function expansion board inserted into the computer or in a function expansion unit connected to the computer, and then causing the CPU or the like provided on the expansion board or in the expansion unit to perform a part or all of the actual operations based on instructions of the program codes.

The form of the program codes may be an object code, a program code executed by an interpreter, script data supplied to an OS, or the like.

While the invention has been shown and described with respect to the embodiment, it will be understood by those skilled in the art that various changes and modifications may be made without departing from the scope of the invention as defined in the following claims.

What is claimed is:

1. A method of plasma processing in a plasma processing apparatus, wherein the plasma processing apparatus includes a processing chamber in which a plasma is generated; a mounting table, for mounting a substrate, which is provided in the processing chamber and to which a plasma attraction high frequency voltage is applied; and a facing electrode provided to face the mounting table in the processing chamber, to which a negative DC voltage is applied, and wherein the substrate comprises an etching target film, and a photoresist film formed on the etching target film, the method comprising:

applying the plasma attraction high frequency voltage to the mounting table for a predetermined period of time to etch the etching target film by using the photoresist film as a mask; and stopping the application of the plasma attraction high frequency voltage to the mounting table to thereby change a surface layer of the photoresist film into a hardened layer, wherein the application of the plasma attraction high frequency voltage and stopping thereof are alternately repeated, and wherein, during both applying the plasma attraction high frequency voltage and stopping the application thereof, the negative DC voltage is applied to the facing electrode.

2. The method of claim 1, wherein the photoresist film has openings formed in a predetermined pattern by which the etching target film is partially exposed.

3. The method of claim 2, wherein the predetermined period of time ranges from 1 second to 120 seconds.

4. The method of claim 1, wherein a magnitude of the negative DC voltage applied to the facing electrode while stopping the application of the plasma attraction high frequency voltage is made larger than that while applying the plasma attraction frequency voltage.

5. The method of claim 4, wherein, while stopping the application of the plasma attraction high frequency voltage, the negative DC voltage applied to the facing electrode is −600 V or less.

6. The method of claim 4, wherein, while stopping the application of the plasma attraction high frequency voltage, the negative DC voltage applied to the facing electrode is −1800 V or less.

7. The method of claim 2, wherein, a magnitude of the negative DC voltage applied to the facing electrode while stopping the application of the plasma attraction high frequency voltage is made larger than that while applying the plasma attraction high frequency voltage.

8. The method of claim 7, wherein, while stopping the application of the plasma attraction high frequency voltage, the negative DC voltage applied to the facing electrode is −600 V or less.

9. The method of claim 7, wherein, while stopping the application of the plasma attraction high frequency voltage, the negative DC voltage applied to the facing electrode is −1800 V or less.

10. The method of claim 3, wherein a magnitude of the negative DC voltage applied to the facing electrode while stopping the application of the plasma attraction high frequency voltage is made larger than that while applying the plasma attraction high frequency voltage.

11. The method of claim 10, wherein, while stopping the application of the plasma attraction high frequency voltage, the negative DC voltage applied to the facing electrode is −600 V or less.

12. The method of claim 10, wherein, while stopping the application of the plasma attraction high frequency voltage, the negative DC voltage applied to the facing electrode is −1800 V or less.

13. The method of claim 1, wherein, while stopping the application of the plasma attraction high frequency voltage, electrons are emitted from the facing electrode and the electrons change a surface layer of the photoresist film into the hardened layer by a curing process.

* * * * *